US010658226B2

(12) United States Patent
Li

(10) Patent No.: US 10,658,226 B2
(45) Date of Patent: May 19, 2020

(54) METHOD FOR PREPARING SOI WAFER BY USING RAPID THERMAL PROCESSING

(71) Applicant: Shenyang Silicon Technology Co., Ltd., Shenyang (CN)

(72) Inventor: Jie Li, Shenyang (CN)

(73) Assignee: Shenyang Silicon Technology Co., Ltd., Shenyang (CN)

( * ) Notice: Subject to any disclaimer, the term of this patent is extended or adjusted under 35 U.S.C. 154(b) by 0 days.

(21) Appl. No.: 16/026,366

(22) Filed: Jul. 3, 2018

(65) Prior Publication Data

US 2019/0326160 A1 Oct. 24, 2019

(30) Foreign Application Priority Data

Apr. 24, 2018 (CN) .......................... 2018 1 0371196

(51) Int. Cl.
*H01L 21/00* (2006.01)
*H01L 21/762* (2006.01)
*H01L 21/322* (2006.01)

(52) U.S. Cl.
CPC .... *H01L 21/76251* (2013.01); *H01L 21/3226* (2013.01)

(58) Field of Classification Search
CPC .................. H01L 21/76254; H01L 21/3226
See application file for complete search history.

(56) References Cited

U.S. PATENT DOCUMENTS

| 2011/0014775 A1* | 1/2011 | Akiyama | .......... | H01L 21/76254 |
| | | | | 438/458 |
| 2015/0017783 A1* | 1/2015 | Kobayashi | ........ | H01L 21/76254 |
| | | | | 438/458 |

OTHER PUBLICATIONS

Yong-Lai Tian, Microwave based technique for ultra-fast and ultra-high temperature thermal processing of compound semiconductors and nano-scale Si semiconductors, 2009, IEEE (Year: 2009).*

* cited by examiner

*Primary Examiner* — Didarul A Mazumder
*Assistant Examiner* — Wasiul Haider
(74) *Attorney, Agent, or Firm* — Maier & Maier, PLLC

(57) ABSTRACT

A method for preparing an SOI wafer by using rapid thermal processing includes: taking a silicon wafer as a raw material, sequentially performing process steps of oxidation, $H^+$ implantation and bonding to obtain a bonded wafer with an $H^+$ implantation layer; and then splitting the bonded wafer by using rapid thermal processing and microwaves to obtain a required SOI wafer. In the present invention, an SOI film after wafer splitting has better thickness uniformity and lower roughness. The present invention may improve lattice damage after implantation and reduce SOI surface defects after wafer splitting and thus improve the SOI surface quality. The present invention is high in wafer-splitting speed and thus reduces silicon wafer contamination. The present invention has high efficiency and an excellent comprehensive technical effect.

7 Claims, 3 Drawing Sheets

METHOD FOR PREPARING SOI WAFER BY USING RAPID THERMAL PROCESSING

FIELD

The present invention relates to the technical field of preparation of semiconductor materials, and particularly provides a method for preparing an SOI wafer by using rapid thermal processing.

BACKGROUND

In 1980, IBM developed and used the process of Separation by Implantation of Oxygen (SIMOX) to develop and manufacture SOI materials. This process needs implantation of a very high dose of oxygen ions (approximately $5 \times 10^{18}/cm^2$). Although a silicon dioxide layer is formed by high-temperature annealing and most of defects are eliminated by re-cleaning, it is still impossible to eliminate all defects caused by ion implantation. In 1992, a French research-oriented company, i.e., Commossariat Al' Energie Atomique, used a thin film transfer technology, i.e., Smart Cut, to successfully transfer a silicon single-crystal thin film to another silicon substrate. In this process, firstly, hydrogen ions are implanted into a silicon wafer that has generated an oxidation layer, and then this silicon wafer is bonded to another silicon wafer. After high-temperature annealing, the implanted hydrogen ions obtain kinetic energy and thus are polymerized into hydrogen molecules to be filled into micro-cracks. The formed hydrogen molecules cannot leave the cracks by diffusion. According to the principle of PV=nRT, the number of hydrogen molecules rapidly increases. Thus, the pressure in the cracks rises, then the micro-cracks are expanded to form a crack panel and are aggregated into a large area of crack holes, and finally, an upper layer and a lower layer of the element wafer are detached to produce a thin film, and the thin film is transferred to a substrate wafer to form an SOI structure.

Another wafer splitting way is TM (thermal microwave) wafer-splitting. The thermal microwave wafer-splitting process uses microwave radiation instead of a traditional heat source. When the silicon wafer reaches a certain temperature by absorbing microwave energy, $H^+$ is aggregated into $H_2$ to achieve the effect of splitting the silicon wafer. However, for the process of microwave wafer-splitting, as the silicon wafer is not heated uniformly, it is easy to cause non-uniformity of final film thickness, and the surface roughness of the SOI after wafer splitting is high.

It is urgently desirable to obtain a method for preparing an SOI wafer by using rapid thermal processing, which has an excellent technical effect.

SUMMARY

An objective of the present invention is to provide a method for preparing an SOI wafer by using rapid thermal processing, which has an excellent technical effect.

The present invention provides a method for preparing an SOI wafer by using rapid thermal processing, comprising: taking a silicon wafer as a raw material, sequentially performing process steps of oxidation, $H^+$ implantation and bonding to obtain a bonded wafer with an $H^+$ implantation layer; and then splitting the bonded wafer by using the rapid thermal processing and microwaves to obtain a required SOI wafer.

Preferable technical requirements for the method for preparing an SOI wafer by using rapid thermal processing are as follows.

The method for preparing an SOI wafer by using rapid thermal processing further comprises: during a wafer splitting process, using a rapid thermal processing (RTP) single-wafer process, heating the wafer to a required temperature not greater than 480° C., and keeping the temperature for 30 seconds to 10 minutes, wherein a temperature increase and decrease rate is 10-200° C./second; and after or during the rapid thermal processing (RTP), applying a microwave process to the bonded wafer for 10 seconds to 20 minutes, wherein the microwave power is required to be adjusted within the range of 0-5000 W.

Oxidizing the silicon wafer which is taken as the raw material comprises: oxidizing one side surface of the silicon wafer raw material to obtain a silicon wafer with an oxidation layer having the thickness of >0-1000 nm; and then, cleaning the silicon wafer to remove contaminants on the surface, and testing particles on the surface of the silicon wafer with the oxidation layer, the thickness of the oxidation layer and other parameters by using a testing device; and selecting a silicon wafer meeting the requirements.

The process step of $H^+$ implantation comprises: implanting $H^+$ into the silicon wafer which has been provided with the oxidation layer, wherein the implantation dosage is 1e15-1e18 and the implantation depth is selected according to demands.

The process step of bonding comprises: preparing another silicon wafer, of which the resistivity and crystal orientation are selected according to demands; cleaning the surface of the another silicon wafer to remove a natural oxidation layer on the surface and contaminants on the surface layer; testing particles on the surface of the another silicon wafer by using a testing device; bonding the another silicon wafer meeting the requirements to the silicon wafer implanted with $H^+$, wherein the activation time of the two silicon wafers is 0-200 seconds; and then performing low-temperature annealing on an obtained bonded wafer at 100-400° C. to obtain a bonded wafer implanted with $H^+$.

In the present invention, the wafer splitting technology comprising the rapid thermal processing (RTP) and the microwave process refers to that the RTP and the microwave process are applied to the silicon wafer at the same time to enable $H^+$ to obtain energy. Thus, $H^+$ implanted in the silicon wafer is aggregated into $H_2$ to achieve the effect of silicon wafer splitting.

The present invention has the following beneficial effects.

1. Compared with a common wafer splitting technology, a wafer splitting way (comprising rapid thermal processing (RTP) and the microwave process) used in the present invention enables energy to more intensively and uniformly act on $H^+$, so that the SIO film after wafer splitting has better thickness uniformity and lower roughness.

2. The present invention may improve lattice damage after implantation and reduce SIO surface defects after wafer splitting and thus improve the SIO surface quality.

3. The wafer splitting process of the present invention is high in wafer splitting speed and thus reduces the silicon wafer contamination.

4. The present invention has high efficiency, improves the productivity and reduces the cost.

To sum up, the present invention has an expectable and relatively large economic value and social value.

BRIEF DESCRIPTION OF THE DRAWINGS

The present invention is further illustrated in detail below with reference to the accompanying drawings and embodiments.

DETAILED DESCRIPTION

Embodiment 1

Figure 1:
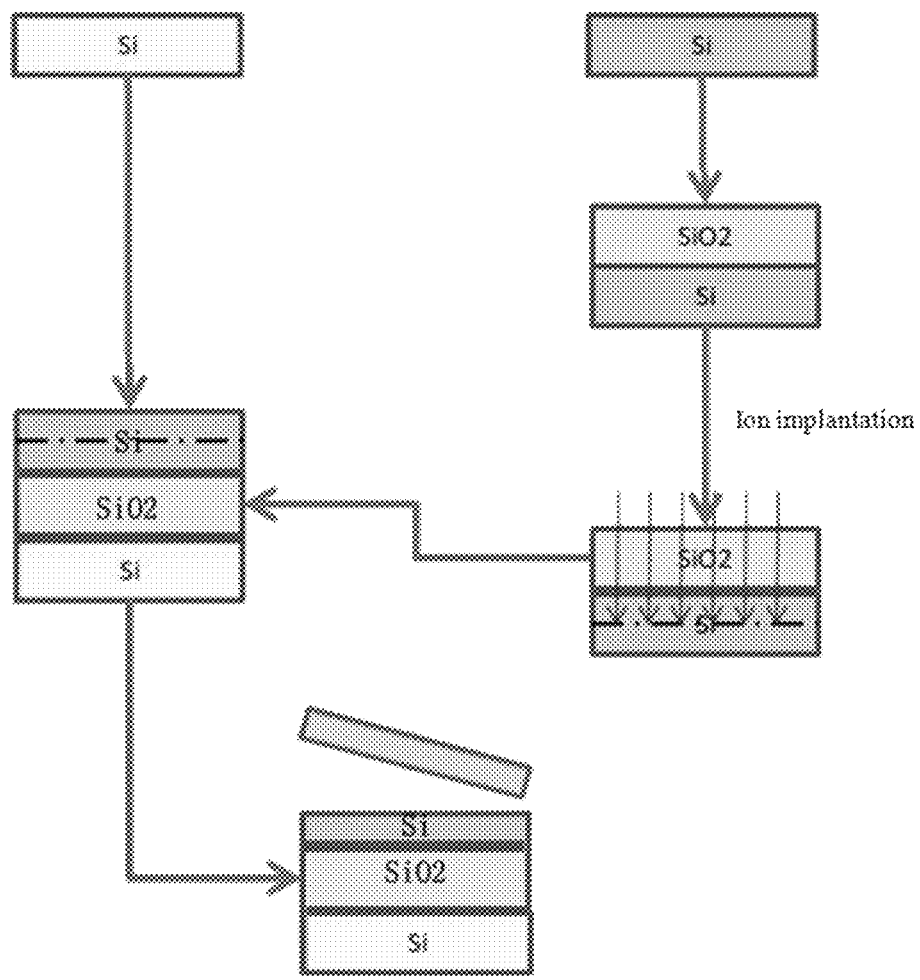
FIG. 1 is a process flowchart of a method for preparing an SOI wafer by using rapid thermal processing in Embodiment 1.

A method for preparing an SOI wafer by using rapid thermal processing comprises: taking a silicon wafer as a raw material, sequentially performing process steps of oxidation, H implantation and bonding to obtain a bonded wafer with an $H^+$ implantation layer, and then splitting the bonded wafer by using the rapid thermal processing and microwaves to obtain a required SOI wafer.

The method for preparing an SOI wafer by using rapid thermal processing further comprises: during a wafer splitting process, using a rapid thermal processing (RTP) single-wafer process, heating the wafer to a required temperature not greater than 480° C., and keeping the temperature for 30 seconds to 10 minutes, wherein a temperature increase and decrease rate is 10-200° C./second; and after or during the rapid thermal processing (RTP), applying a microwave process to the bonded wafer for 10 seconds to 20 minutes, wherein the microwave power is required to be adjusted within the range of 0-5000 W.

Oxidizing the silicon wafer which is taken as the raw material comprises: oxidizing one side surface of the silicon wafer raw material to obtain a silicon wafer with an oxidation layer having the thickness of >0-1000 nm; and then, cleaning the silicon wafer to remove contaminants on the surface, and testing particles on the surface of the silicon wafer with the oxidation layer, the thickness of the oxidation layer and other parameters by using a testing device; and selecting a silicon wafer meeting the requirements.

The process step of $H^+$ implantation comprises: implanting $H^+$ into the silicon wafer which has been provided with the oxidation layer, wherein the implantation dosage is 1e15-1e18 and the implantation depth is selected according to demands.

The process step of bonding comprises: preparing another silicon wafer, of which the resistivity and crystal orientation are selected according to demands; cleaning the surface of the another silicon wafer to remove a natural oxidation layer on the surface and contaminants on the surface layer; testing particles on the surface of the another silicon wafer by using a testing device; bonding the another silicon wafer meeting the requirements to the silicon wafer implanted with $H^+$, wherein the activation time of the two silicon wafers is 0-200 seconds; and then performing low-temperature annealing on an obtained bonded wafer at 100-400° C. to obtain a bonded wafer implanted with $H^+$.

In this embodiment, the wafer splitting technology comprising the rapid thermal processing (RTP) and the microwave process refers to that the RTP and the microwave process are applied to the silicon wafer at the same time to enable $H^+$ to obtain energy. Thus $H^+$ implanted in the silicon wafer is aggregated into $H_2$ to achieve the effect of silicon wafer splitting.

This embodiment has the following beneficial effects.

1. Compared with a common wafer splitting technology, a wafer splitting way (comprising rapid thermal processing (RTP) and the microwave process) used in this embodiment enables energy to more intensively and uniformly act on $H^+$, so that the SIO film after wafer splitting has better thickness uniformity and lower roughness.

2. This embodiment may improve lattice damage after implantation and reduce SIO surface defects after wafer splitting and thus improve the SIO surface quality.

3. The wafer splitting process of this embodiment is high in wafer splitting speed and thus reduces the silicon wafer contamination.

4. This embodiment has high efficiency, improves the productivity and reduces the cost.

To sum up, this embodiment has an expectable and relatively large economic value and social value.

Embodiment 2

This embodiment is a method for preparing an SOI wafer by using a wafer splitting technology comprising RTP and a microwave process, and a process flowchart of the method is as shown in FIG. 1. This method comprises the following steps: taking a silicon wafer as a raw material, sequentially performing process steps of oxidation, implantation of a low dose of $H^+$ and bonding to obtain a bonded wafer with an $H^+$ implantation layer; and processing the bonded wafer by using the splitting technology comprising RTP and the microwave process and having specific process parameters to obtain a required SOI wafer.

Embodiment 1

This embodiment comprises the following steps: 1. taking a 8-inch P-type silicon wafer, wherein the crystal orientation of the silicon wafer may be <100> or <111> and the resistivity is selected according to the fact that the silicon wafer is heavily doped to have high resistivity;

2. preparing an oxidation layer (silicon dioxide) on the silicon wafer: oxidizing one side surface of the silicon wafer in step 1 (or oxidizing two side surfaces according to actual process conditions) to obtain a silicon wafer with an oxidation layer (silicon dioxide is used as a BOX layer of SOI), wherein the oxidation is performed by using a conventional process, and the thickness of the prepared oxidation layer is >0-1000 nm; cleaning the prepared silicon wafer with the oxidation layer by using SC1 and SC2 sequentially to remove contaminants on the surface of the silicon wafer; then testing particles on the surface of the silicon wafer by using a testing device and testing the thickness of silicon oxide and other parameters (such as particles and electrical parameters of a silicon oxide layer) by using the testing device; and selecting a silicon wafer meeting requirements for use in the next step;

3. implanting a low dose of hydrogen ions into the silicon wafer with the oxidation layer, wherein the implantation dosage is 1e15-1e18, and the implantation depth is selected according to demands (the depth is 0-1000 nm usually);

4. selecting a 8-inch bare wafer, of which the resistivity and crystal orientation are selected according to demands; cleaning the surface of the wafer by using DHF, SC1, SC2 sequentially to remove a natural oxidation layer on the surface and contaminants possibly existing on the surface layer; testing the particles on the surface of the silicon wafer by using a testing device; and selecting a silicon wafer meeting the requirements for later use;

5. a bonding process: bonding the silicon wafer implanted with the hydrogen ions in step 3 to the silicon wafer meeting the requirements in step 4, wherein the activation time in the bonding process is 0-200 seconds; and then performing low-temperature annealing at the annealing temperature of 100-350 IC for 0-8 hours to obtain a bonded wafer implanted with $H^+$;

6. splitting the bonded wafer by using RTP and microwaves: by using a rapid thermal processing (RTP) single-wafer process, heating the wafer to 300° C. at the temperature increase rate of 100° C./second; keeping the temperature for 5 minutes; and at the same time, irradiating the wafer with the microwaves with the power of 2000 W for 1 minute to split the wafer; and 7. obtaining high-quality 8-inch SOI through step 6, performing subsequent processing and recycling the SOI wafer according to company regulations.

Comparative Example 1

Figure 2:
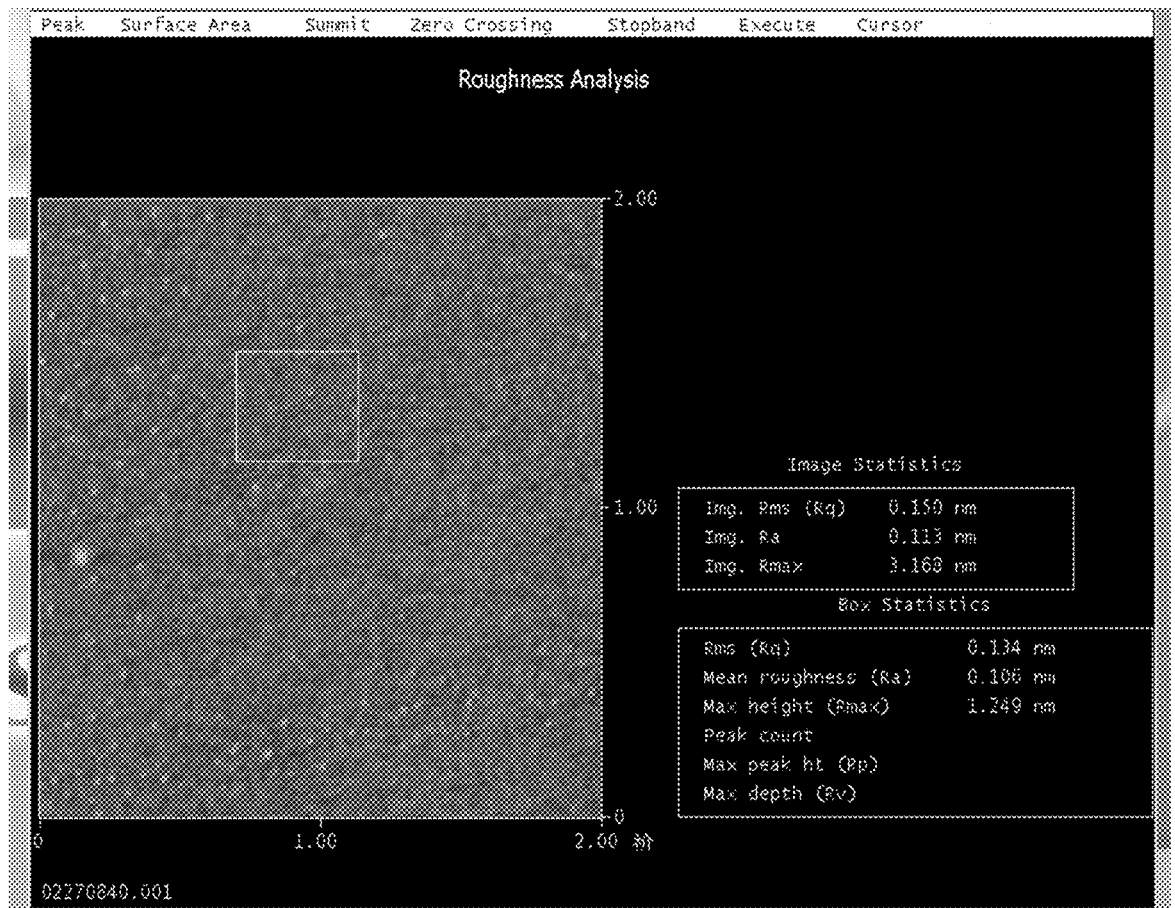
FIG. 2 is a surface of an SOI wafer prepared in Embodiment 2.
Figure 3:
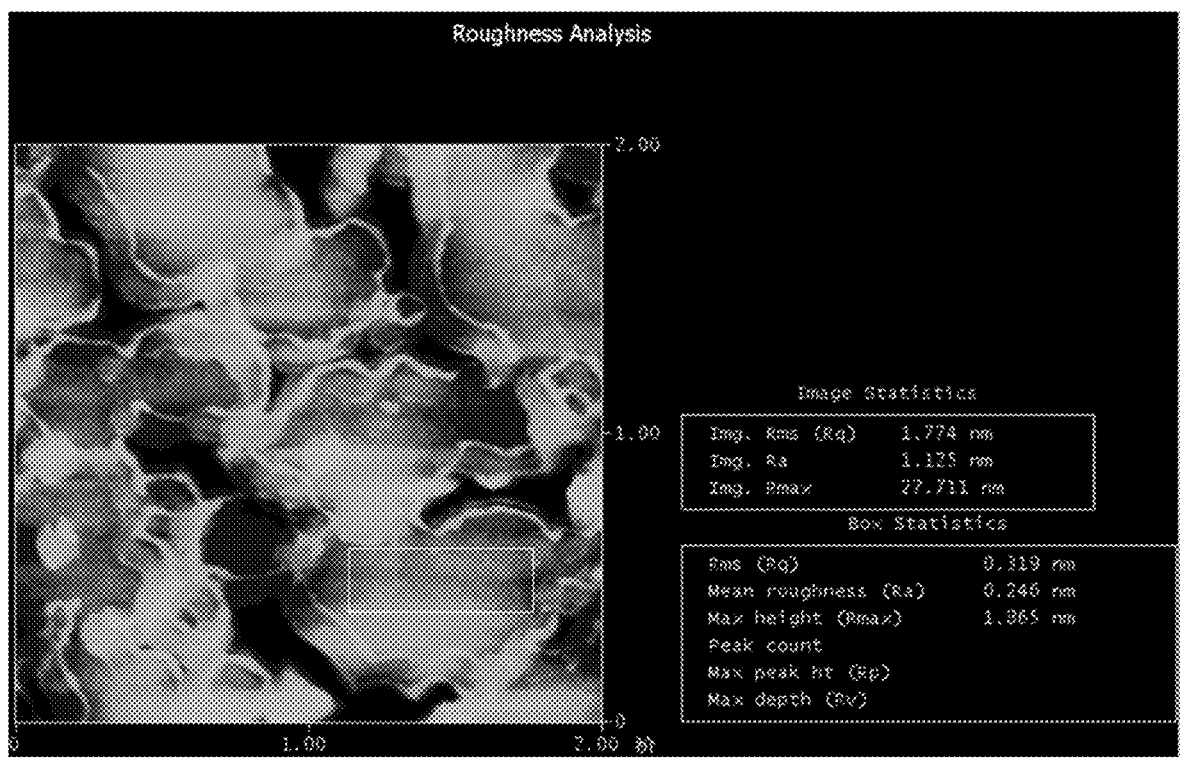
FIG. 3 is a surface of an SOI wafer prepared in Comparative Example 2.

Comparative Example 1 differs from Embodiment 1 in that: an SOI structure is obtained by using a common microwave wafer-splitting way in step 6. Surface morphologies of the SOI wafers obtained in Embodiment 1 and Comparative Example 1 are shown in FIGS. 2 and 3, and the comparison about thickness uniformity of top-layer films is shown in table 1. It can be seen from the comparison that both the thickness uniformity and roughness of the top-layer film of SOI obtained by using the wafer splitting technology of this embodiment are obviously superior to those of the SOI wafer obtained by using a common microwave splitting technology in Comparative Example 1.

TABLE 1

Comparison table about thickness uniformity of top-layer films

Average film thickness: 145 nm
Film thickness uniformity

| | Embodiment 1 | Comparative Example 1 |
|---|---|---|
| 1 | 2.2% | 4.5% |
| 2 | 1.5% | 4.0% |
| 3 | 1.5% | 5.8% |
| 4 | 2.5% | 4.7% |
| 5 | 2.0% | 5.8% |
| 6 | 2.3% | 5.6% |
| 7 | 1.2% | 5.0% |
| 8 | 2.5% | 4.1% |
| 9 | 2.9% | 4.6% |
| 10 | 2.7% | 5.2% |

The above description is only preferred embodiments of the present invention, and is not intended to limit the scope of protection of the present invention. Equivalent changes or modifications made without departing from the spirit of the present invention should be comprised within the scope of the patent application and the claims.

The invention claimed is:

1. A method for preparing an SOI wafer by using rapid thermal processing, comprising:
taking a silicon wafer as a raw material, sequentially performing process steps of oxidation, $H^+$ implantation and bonding to obtain a bonded wafer with an $H^+$ implantation layer; and splitting the bonded wafer by using the rapid thermal processing and microwaves to obtain a required SOI wafer, wherein the wafer splitting process further comprises, by using a rapid thermal processing single-wafer process, heating the wafer to a required temperature not greater than 480° C., and maintaining the temperature for 30 seconds to 10 minutes, wherein a temperature increase and decrease rate is 10-200° C./second; and
after or during the rapid thermal processing, applying a microwave process to the bonded wafer for 10 seconds to 20 minutes, wherein a microwave power of the microwave process is required to be adjusted within a range of greater than 0 W and less than or equal to 5000 W.

2. The method for preparing an SOI wafer by using rapid thermal processing according to claim 1, wherein oxidizing the silicon wafer which is taken as the raw material comprises: oxidizing one side surface of the silicon wafer raw material to obtain a silicon wafer with an oxidation layer having the thickness greater than 0 nm and less than or equal to 1000 nm.

3. The method for preparing an SOI wafer by using rapid thermal processing according to claim 1, wherein oxidizing the silicon wafer which is taken as the raw material comprises: oxidizing one side surface of the silicon wafer raw material to obtain a silicon wafer with an oxidation layer having the thickness greater than 0 nm and less than or equal to 1000 nm.

4. The method for preparing an SOI wafer by using rapid thermal processing according to claim 2, wherein the step of $H^+$ implantation comprises: implanting $H^+$ into the silicon wafer which has been provided with the oxidation layer, wherein the implantation dosage is 1e15-1e18/cm$^2$, and the implantation depth depends on implantation energy which is in the range of 10-500 Kev.

5. The method for preparing an SOI wafer by using rapid thermal processing according to claim 3, wherein the step of $H^+$ implantation comprises: implanting $H^+$ into the silicon wafer which has been provided with the oxidation layer, wherein the implantation dosage is 1e15-1e18/cm$^2$, and the implantation depth depends on implantation energy which is in the range of 10-500 Kev.

6. The method for preparing an SOI wafer by using rapid thermal processing according to claim 2, wherein the bonding step comprises: preparing a second silicon wafer, of which the resistivity and crystal orientation are selected according to demands; cleaning a surface of the second silicon wafer to remove a natural oxidation layer on the surface and contaminants on the surface; testing particles on the surface of the second silicon wafer by using a testing device; bonding the second silicon wafer meeting the requirements to the silicon wafer implanted with $H^+$, wherein the activation time of the two silicon wafers is greater than 0 seconds and less than or equal to 200 seconds; and then performing low-temperature annealing on an obtained bonded wafer at 100-400° C. to obtain a bonded wafer implanted with $H^+$.

7. The method for preparing an SOI wafer by using rapid thermal processing according to claim 3, wherein the bonding step comprises: preparing a second silicon wafer, of which the resistivity and crystal orientation are selected according to demands; cleaning a surface of the second silicon wafer to remove a natural oxidation layer on the surface and contaminants on the surface; testing particles on the surface of the second silicon wafer by using a testing device; bonding the second silicon wafer meeting the requirements to the silicon wafer implanted with $H^+$, wherein the activation time of the two silicon wafers is greater than 0 seconds and less than or equal to 200 seconds; and then performing low-temperature annealing on an obtained bonded wafer at 100-400° C. to obtain a bonded wafer implanted with $H^+$.

* * * * *